(12) United States Patent
Leussler

(10) Patent No.: US 7,230,425 B2
(45) Date of Patent: Jun. 12, 2007

(54) MRI SYSTEM WITH WIRELESS IDENTIFICATION CAPABILITY

(75) Inventor: Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/567,981

(22) PCT Filed: Aug. 5, 2004

(86) PCT No.: PCT/IB2004/002614

§ 371 (c)(1),
(2), (4) Date: Feb. 10, 2006

(87) PCT Pub. No.: WO2005/017548

PCT Pub. Date: Feb. 24, 2005

(65) Prior Publication Data

US 2006/0232275 A1    Oct. 19, 2006

(51) Int. Cl.
*G01V 3/00* (2006.01)
(52) U.S. Cl. .................... 324/318; 324/322
(58) Field of Classification Search ............. 324/318, 324/322
See application file for complete search history.

(56) References Cited

U.S. PATENT DOCUMENTS 5,250,944 A * 10/1993 Urbas et al. ........... 340/870.31
RE36,495 E     1/2000 Blakeley et al. ........... 600/410
6,346,886 B1 *  2/2002 De La Huerga ......... 340/573.1
6,362,622 B1   3/2002 Stauber et al. ............ 324/318
6,394,353 B1 *  5/2002 Schmitt ................. 235/462.15
6,545,475 B2   4/2003 Kroeckel et al. .......... 324/318
6,725,079 B2 *  4/2004 Zuk et al. ................ 600/414
2002/0067263 A1  6/2002 Tafoya et al. ............ 340/572.1

FOREIGN PATENT DOCUMENTS

EP      1 321 097 A2    6/2003
JP         4193162       7/1992
WO     WO 03/032002     4/2003

* cited by examiner

Primary Examiner—Louis M. Arana
(74) Attorney, Agent, or Firm—Thomas M. Lundin

(57) ABSTRACT

A magnetic resonance apparatus includes a main magnetic field generating assembly (12) located in a magnetic resonance suite generates a substantially spatially constant main magnetic field through at least a portion of a subject in an imaging region. A gradient field generating assembly (16) overlays spatially variant gradient magnetic fields onto the main magnetic field. A radio frequency assembly (22) excites magnetic resonance in dipoles of a subject in the imaging region. A receiver (36) receives magnetic resonance signals from resonating dipoles in the imaging region. Radio frequency transponders (60) are affixed to objects (22, 104, 106, 108, 110, 114) in the magnetic resonance suite. The transponders (60) are interrogated by a reader/writer (62) to determine which coils are in the bore (14) and whether other coils and objects are outside of a safety threshold (116).

20 Claims, 4 Drawing Sheets

MRI SYSTEM WITH WIRELESS IDENTIFICATION CAPABILITY

CROSS REFERENCE TO RELATED APPLICATIONS

This application claims the benefit of U.S. provisional application Ser. No. 60/495,605 filed Aug. 15, 2003, which is incorporated herein by reference.

The present invention relates to the diagnostic imaging arts. It finds particular application in conjunction with tracking and identifying physical objects and their locations in a magnetic resonance imaging suite and will be described with particular reference thereto. However, it is to be appreciated that the present invention is applicable to a wide range of diagnostic imaging modalities and to other non-medical imaging applications as well.

In a diagnostic imaging setting, a plurality of physical objects are present in the suite along with the scanner and the subject. Some of these objects (such as local transmit and receive coils) are meant to be used within the field of a magnetic resonance scanner as part of the imaging process, while others are kept in the suite for other reasons, such as convenience. Modern bore type magnetic resonance scanners can generate extremely high magnetic fields, exerting great forces on magnetically attractable objects nearby. High gradient and RF fields/pulses can also induce high currents in unconnected or improperly connected local RF coils in the bore, causing them to heat and possibly burn the subject and/or damage themselves.

Presently, when an RF coil is connected to an MR system, an operator can interrogate the coil electronically and identify it by its encoded identification. When the coil is connected to the scanner, the scanner operating system interrogates the coil through its physical connection, thereby discovering the identity of the coil. Present systems, however, do not report any unconnected coils, because there is no way of the system knowing what coils are present without them being physically connected. Hence, problems can arise, with improperly connected RF coils, coils which the operator disconnects between scans but neglects to remove before the next scan, coils which an operator forgets to connect, and the like.

Similarly, an operator may use devices to aid subject preparation or positioning. Some of these objects may degrade image quality or cause other problems if left or positioned in the bore of the scanner improperly. Once again, the scanner has no way of detecting these types of objects prior to the initiation of an imaging scan.

In many modern imaging facilities, scanners of more than one imaging modality are housed in the same room. For instance, a CT scanner may be housed in the same room as an MR scanner. The room also houses associated equipment and accessories as well as tools which are safe to use in their associated scanner but not all scanners. For example, metallic tools and other objects for use in conjunction with the CT scanner may be inadvertently placed dangerously close to the MR scanner. Such an object can be attracted by the main field of the MR scanner and accelerated toward its isocenter where a patient is typically positioned. Gradient magnetic field pulses and RF pulses can cause eddy currents in conductive objects damaging the objects. These pulses can have adverse effects on electronic equipment, such as the other scanner, monitors, and the like that are positioned too close. Conversely, ferromagnetic objects too close to the bore can distort magnetic fields and cause image artifacts.

The present application contemplates a new and improved object identification system, which overcomes the above-referenced problems and others.

In accordance with one aspect of the present invention, a magnetic resonance apparatus is provided. A main magnetic field generating assembly located in a magnetic resonance suite generates a substantially spatially constant main magnetic field through at least a portion of a subject in an imaging region. A gradient field generating assembly overlays spatially variant gradient magnetic fields onto the main magnetic field. A radio frequency assembly excites magnetic resonance in dipoles in the imaging region. A receiver receives magnetic resonance signals from the imaging region. A radio frequency transponder in the magnetic resonance suite indicates the physical presence of a device with which it is associated.

In accordance with another aspect of the present invention, a method of magnetic resonance is provided. A main magnetic field is generated through an imaging region. A radio frequency transponder is interrogated, the transponder being associated with a physical object. Gradient magnetic fields are overlayed onto the main magnetic field. Magnetic resonance is excited in selected dipoles of at least a portion of a subject located in the imaging region. The magnetic resonance signals are received, demodulated, and reconstructed into an image representation.

In accordance with another aspect of the present invention, a magnetic resonance apparatus is provided. A main magnetic field generating assembly for ggenerating a main magnetic field in an imaging region. A gradient field assembly imposes spatially variant gradient fields onto the main magnetic field. A radio frequency transmit/receive assembly excites magnetic resonance in selected dipoles within the imaging region. At least one local radio frequency receive coil is located within a bore of the magnetic resonance apparatus. The coil has an electrical connection to the magnetic resonance apparatus. A Radio frequency identification transponder is attached to the receive coil and carries at least the identity of the receive coil in an on-board memory. A connection interrogator determines identities of coils electrically connected to the apparatus. A transponder reader/writer determines identities of coils physically present inside the bore. A comparitor detects discrepancies between the identities of the coils electrically connected to the apparatus and those physically present inside the bore.

One advantage of the present invention is increased safety for subjects in MR scans.

Another advantage of the present invention lies in avoidance of possible damage to the scanner and/or nearby equipment.

Another advantage lies in the detection of inappropriate equipment approaching an MR scanner.

Another advantage lies in reduced possibility of error, lessening the probability of needing repeated scans.

Still further advantages and benefits of the present invention will become apparent to those of ordinary skill in the art upon reading and understanding the following detailed description of the preferred embodiments.

The invention may take form in various components and arrangements of components, and in various steps and arrangements of steps. The drawings are only for purposes of illustrating the preferred embodiments and are not to be construed as limiting the invention.

Figure 1:
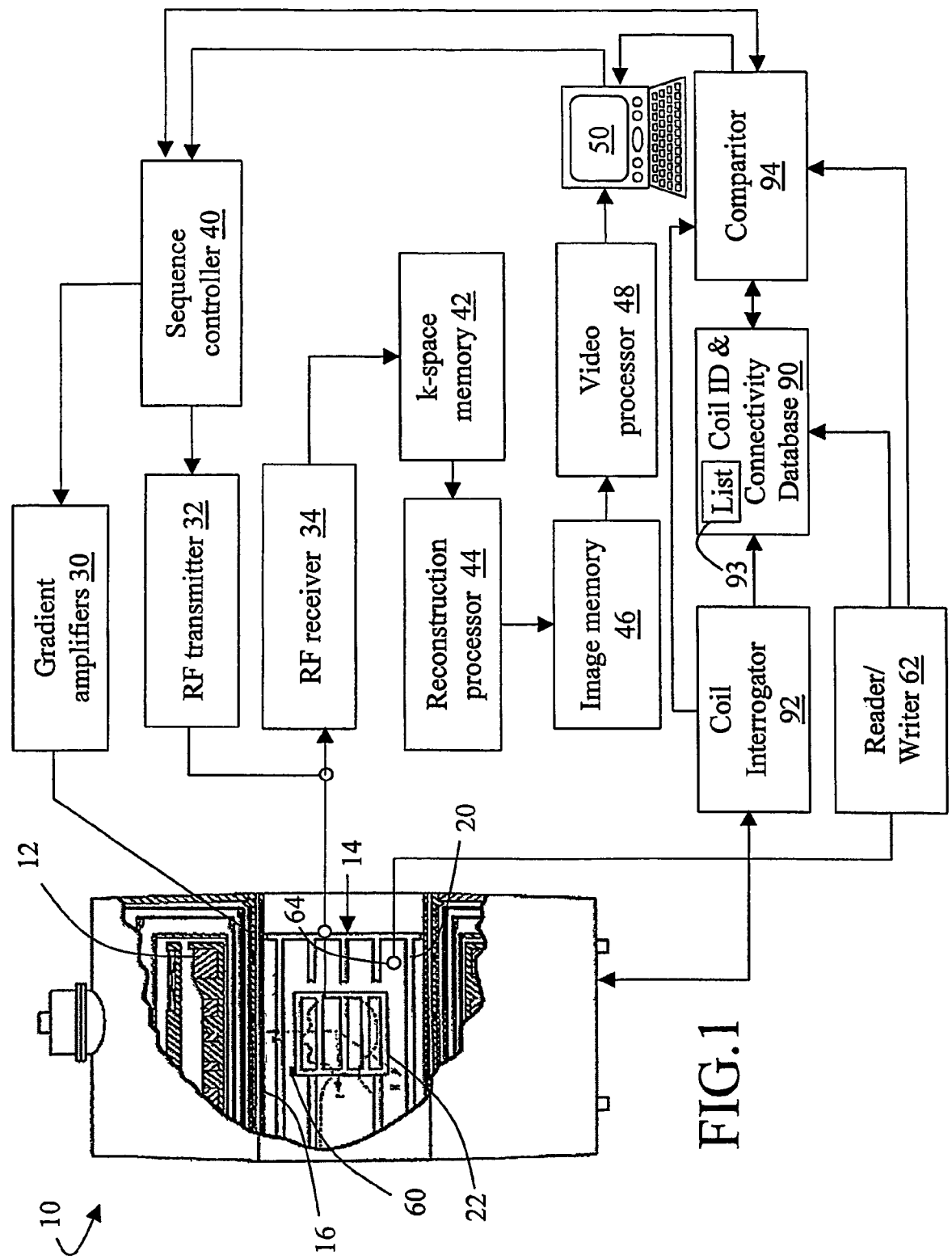
FIG. 1 is a diagrammatic illustration of a magnetic resonance apparatus with associated radio frequency identification (RFID) elements.

With reference to FIG. 1, a magnetic resonance scanner 10 includes a cylindrical main magnet assembly 12. The main magnet assembly 12 is preferably a superconducting cryoshielded solenoid, defining a bore 14 into which a subject is placed for imaging. The main magnet assembly 12 produces a substantially constant main magnetic field oriented along a longitudinal axis of the bore 14. Although a cylindrical main magnet assembly 12 is illustrated, it is to be understood that other magnet arrangements, such as vertical field, open magnets, non-superconducting magnets, and other configurations are also contemplated.

A gradient coil 16 produces magnetic field gradients in the bore 14 for spatially encoding magnetic resonance signals, for producing magnetization-spoiling field gradients, or the like. Preferably, the magnetic field gradient coil 16 includes coil segments configured to produce magnetic field gradients in three orthogonal directions, typically longitudinal or z, transverse or x, and vertical or y directions.

A whole body radio frequency coil assembly 20 generates radio frequency pulses for exciting magnetic resonance in dipoles of the subject. The radio frequency coil assembly 20 also serves to detect magnetic resonance signals emanating from the imaging region. An additional local coil array 22, such as a head coil, is located within the bore 14 for more sensitive, localized spatial encoding, excitation, and reception of magnetic resonance signals. Various types of local coil arrays are contemplated such as a simple surface RF coil with one output, a quadrature coil assembly with two outputs, a phased array with several outputs, a SENSE coil array with dozens of outputs, combined RF and gradient coils with both outputs and inputs, and the like.

Gradient pulse amplifiers 30 deliver controlled electrical currents to the magnetic field gradient coils 16 to produce selected magnetic field gradients. The gradient amplifiers also deliver electrical pulses to the gradient coils of local coil arrays that are equipped with gradient coils. A radio frequency transmitter 32, preferably digital, applies radio frequency pulses or pulse packets to the radio frequency coil assembly 20 to generate selected magnetic resonance excitations. A radio frequency receiver 34, also coupled to the radio frequency coil assembly 20, receives magnetic resonance signals. When local coils or are used, the local coils are optionally used for both the magnetic resonance excitation and detection operations.

To acquire magnetic resonance imaging data of a subject, the subject is placed inside the magnet bore 14, preferably at or near an isocenter of the main magnetic field. A sequence controller 40 communicates with the gradient amplifiers 30 and the radio frequency transmitter 32 to produce selected transient or steady-state magnetic resonance sequences, to spatially encode such magnetic resonances, to selectively spoil magnetic resonances, or otherwise generate selected magnetic resonance signals characteristic of the subject. The generated magnetic resonance signals are detected by the radio frequency receiver 34, and stored in a k-space memory 42. The imaging data is reconstructed by a reconstruction processor 44 to produce an image representation that is stored in an image memory 46. In one suitable embodiment, the reconstruction processor 44 performs an inverse Fourier transform reconstruction.

The resultant image representation is processed by a video processor 48 and displayed on a user interface 50 equipped with a human readable display. The interface 50 is preferably a personal computer or workstation. Rather than producing a video image, the image representation can be processed by a printer driver and printed, transmitted over a computer network or the Internet, or the like. Preferably, the user interface 50 also allows a radiologist or other operator to communicate with the magnetic resonance sequence controller 40 to select magnetic resonance imaging sequences, modify imaging sequences, execute imaging sequences, and so forth.

With continuing reference to FIG. 1, each local coil 22 has an embedded transponder 60. Depending on the size and shape of the transponder 60, it can be attached to the coil 22 several different ways, including, but not limited to, being embedded under the surface of the coil, attached to the surface of the coil, and manufactured along with the coil. A transponder reader/writer 62 interrogates the transponder 60 using an in bore antenna 64 to recover the information that the transponder carries in an internal memory. The transponder reader/writer 62 communicates with the transponder 60 by radio at frequencies that are well displaced from the resonant frequency so that the antenna 64 is insensitive to resonance frequencies and does not interfere with imaging. Alternately, the antenna can be detuned during magnetic resonance excitation and reception.

Figure 2:
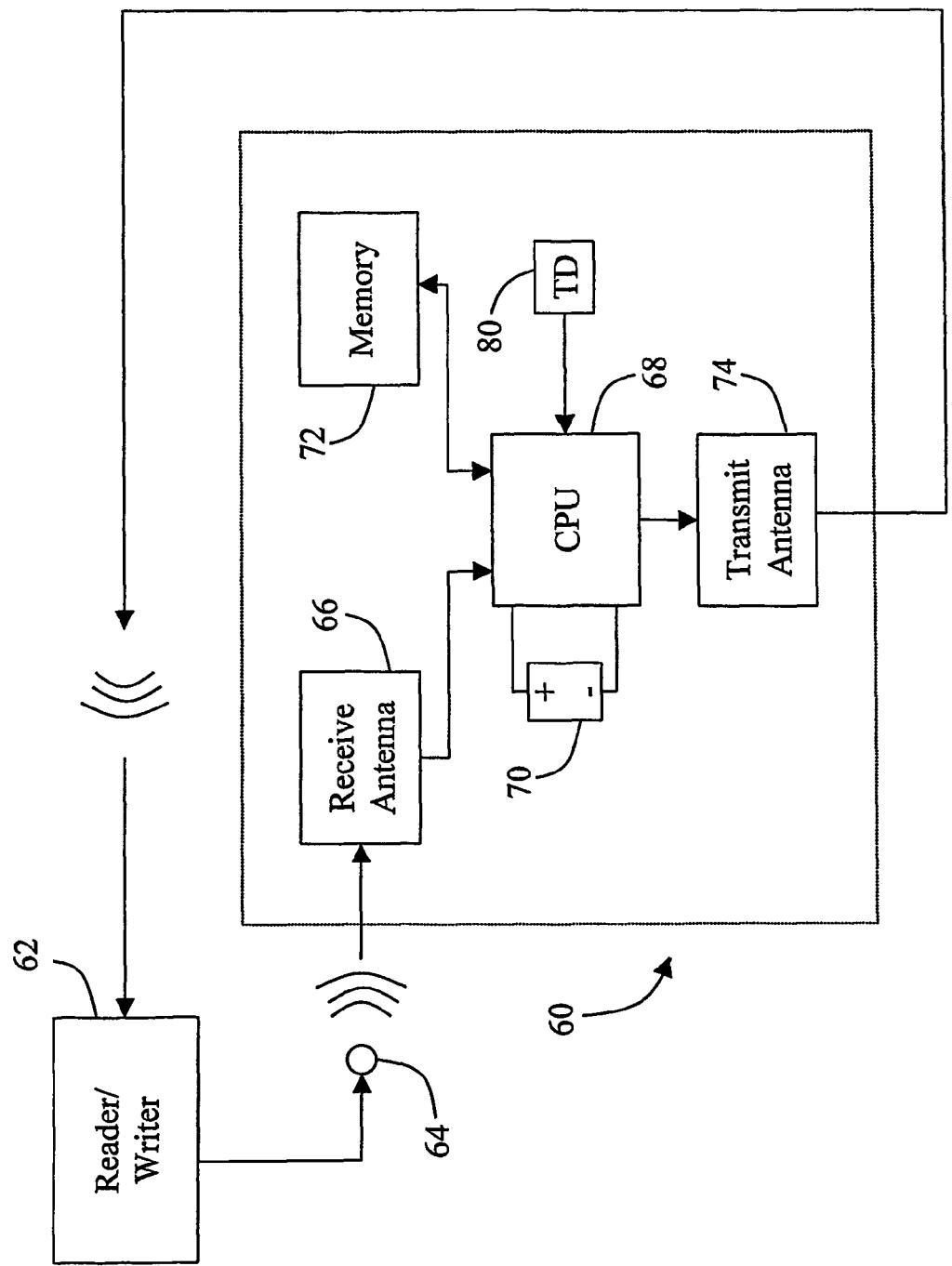
FIG. 2 is a diagrammatic illustration of an active radio frequency transponder.

In one embodiment, the transponder 60 is an active transponder, that is, it carries its own on-board power source. With an active transponder embodiment, the transponder 60 can respond to a query sent by the reader/writer 62 under its own power. With reference to FIG. 2, the transponder 60 includes a receive antenna portion 66 that receives an interrogation request from the reader/writer 62. A CPU 68, which is powered by an on-board battery 70 accesses a transponder memory 72. The CPU 68 then relays information to be transmitted to a transmit antenna portion 74 of the transponder, and the information is broadcast at the transponder's 60 operating frequency. Of course, the same antenna can be used for transmit and receive.

Alternatively, the transponder 60 could continuously transmit its contents, and the reader/writer could receive the data. Some advantages of active transponders lie in greater range, less signal needed to activate them, and lower direction dependency. Some disadvantages lie in physical size, and battery-dependent lifespan.

Typically, radio frequency transponders and readers, also known as RFIDs, operate in a range of 125 kHz to 2.4 GHz. Some state of the art systems are employing transponders that operate above 5 GHz, but are presently less common. The operating frequency is selected to meet the needs of the end user, taking into consideration the benefits and drawbacks of the different frequencies. Typically, lower frequency RFID systems tend to be shorter range, can be affected by orientation of the reader antenna with respect to range, and require larger antennae, but cost less and require less operating power. Higher frequency RFID systems have longer operational ranges that are less affected by reader antenna orientation, require smaller antennae, but are more costly than lower frequency systems, and tend to be more direction dependent. Additionally, due to power consumption rates, higher frequency RFID systems are more likely to employ active transponders than passive.

Another factor to consider when selecting an operating frequency for the RFID system is the transmit frequencies of the RF coils 20, 22 and the resultant Larmor frequencies of resonating dipoles. Preferably, the operating frequency of the RFID system is sufficiently removed from the operating frequencies of the magnetic resonance apparatus so that there is no interference between the signals, the transponders are not activated by the radio frequency coils, the RFID antenna does not distort the linearity of the MR system, etc. In sum, the operating frequency of the RFID system is selected to best suit the needs of the given environment.

Figure 3:
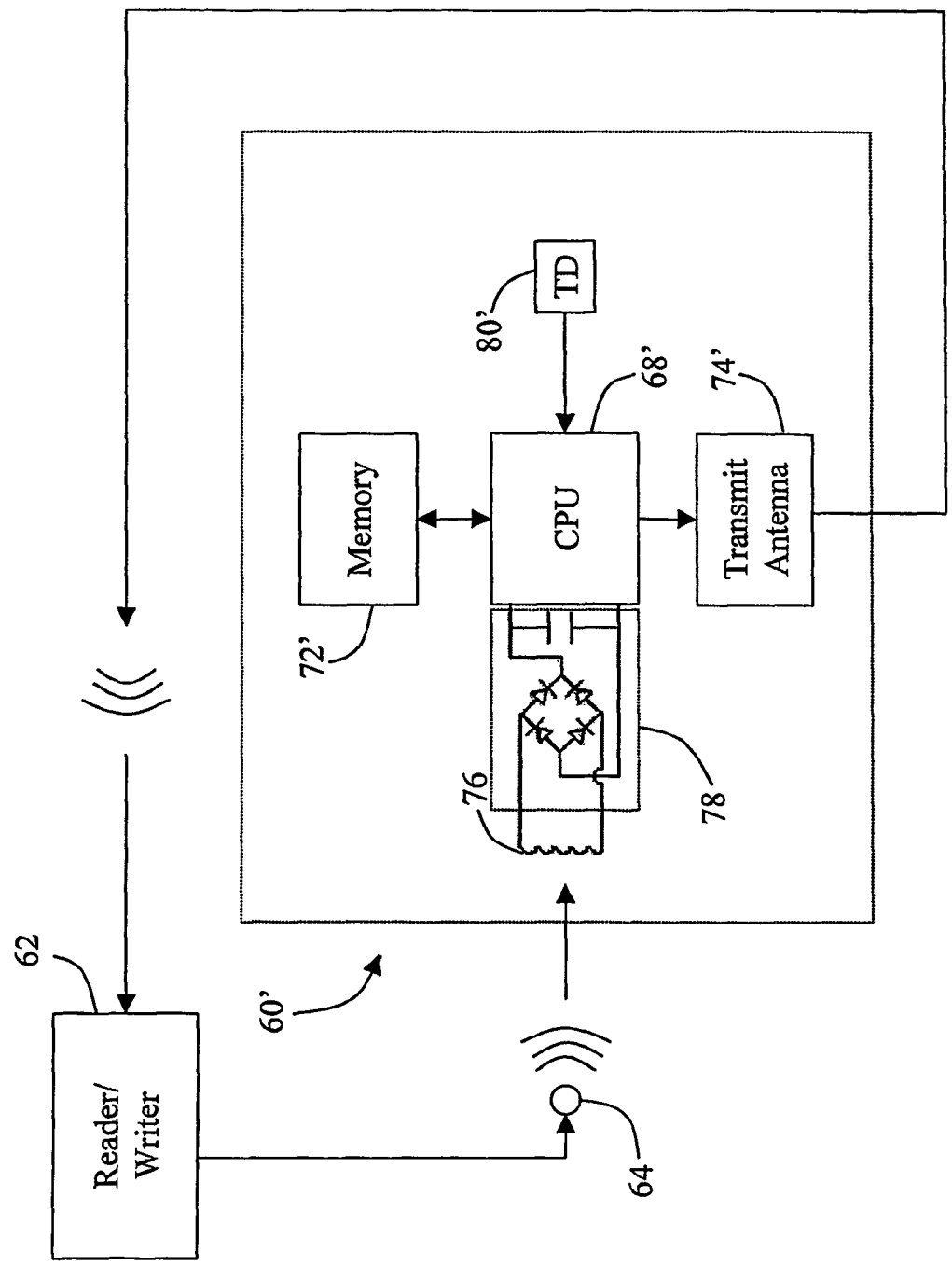
FIG. 3 is a diagrammatic illustration of a passive radio frequency transponder.

In a different embodiment, the transponder is a passive transponder, meaning that it does not have an on-board battery. The reader/writer 62 sends a radio frequency wakeup call, which is a combined interrogation/request for response and a power supply. With reference to FIG. 3, a passive transponder 60' includes a receive coil transformer portion 76 and a temporary power supply 78 that converts radio frequency energy sent by the reader/writer 62 into electrical power for the transponder 60'. A CPU 68' retrieves stored information from a memory 72' and prepares the information for transmission. A transmit antenna 74' broadcasts the information, which is received by the reader/writer 62.

The memories 72, 72' can be read only memories (ROM), write once read many (WORM), or read/write (R-W). ROM type memories are preferably set at the time of manufacture to identify the object with which the transponder 60, 60' is to be associated. Transponders having WORM type memories have more generic application, because their memories can be set by the end user to correspond to whatever application the transponder is to be used. Transponders having read/write memories are more versatile in that they can be updated with new information concerning their present job, or retasked to correspond to a new, different job. While it is preferred that the transponder 60, 60' always be associated with the same object, information could be updated. Information stored in the transponder memory 72, 72' of the preferred embodiment at least includes the identity of the object with which the transponder 60, 60' is associated. Other information that can be stored in the transponder memory may include the date the transponder was manufactured, and in a read/write embodiment, the date/time the transponder was last queried, estimated battery life, and other information.

In one suitable embodiment, interrogation signals from the reader/writer 62 are directed into the bore 14. Each transponder 60, 60' present in the bore 14 at that time receives the interrogation signal and responds. To avoid confusion and interference during response, each transponder 60, 60' has its own code or ID. when the CPU recognizes its code, or an "all call" code, it triggers a response. Alternately, each transponder 60, 60' operating in the current environment is assigned a different response frequency. As another option, with reference to FIGS. 2 and 3, each transponder 60, 60' has a time delay circuit 80 and 80' with a different time delay such that the reader/writer 62 is not overwhelmed by several concurrent signals.

Once the reader/writer has interrogated the transponders 60, 60' and received responses, the system is ready to make a comparison against a coil identification(s) received through physical interconnections with the coil outputs and inputs. A coil connectivity database 90 correlates identities of the coils read through physical attachments to the magnetic resonance system with the corresponding transponder identity. A coil connectivity interrogator 92 senses the IDs of the physically connected coils. The database 90 also houses a list of approved objects 93 allowable in the bore, and works in tandem with the interrogator 92 to update the list as coils are connected and disconnected from the system. Preferably, a coil that is disconnected from the system is removed from the list of approved object allowable in the bore 14 during a scan. A comparitor 94 compares the coils which are physically connected to the scanner with the coils which the transponders 60, 60' identify as being in the bore. If all of the coils in the bore 14 are connected, then they will be on the list of approved objects. If discrepancies exist, the comparitor 94 provides an alarm, or holds commencement of any sequence until the discrepancy is remedied. Preferably, the sequence controller 40 is also connected to the comparitor 94 to provide a list of the coils that should be in the bore for the selected sequence, further refining the list of approved objects.

In an alternate embodiment, the coil database 90 also stores a list of the required connections for each coil that can be used in the system and it's ID and it's transponder ID. The coil interrogator 92 further measures resistance, inductance, capacitance, or other electrical properties of each electrical connection to the coil. The comparitor 94 compares the actually measured electrical connection properties with the prescribed connection properties from the coil ID and connectively memory 90 to determine if every winding of the coil is not only connected, but connected to the proper lead.

In a multiple reader embodiment, a single interrogation is sent into the bore 14 causing the transponders to respond. Each of a plurality of readers placed in known positions about the magnetic resonance device receive the responses from the transponders within the bore 14. A distance and/or direction between the reader and the transponder can be calculated. Taken all together, the distances or directions between the transponder and each of the readers can be used to triangulate the position of the transponder within the bore.

In an alternate embodiment, other objects that are always in the magnetic resonance imaging suite are tagged with transponders. These objects include objects that are used during the imaging process, (such as wedges and supports for positioning the subject) as well as extraneous objects (such as wheelchairs, gurneys, and items used in conjunction with other modalities housed in the same suite). If one or more of these objects approaches dangerously close to the magnetic resonance scanner 10, an alarm or sequence cancellation is triggered.

Figure 4:
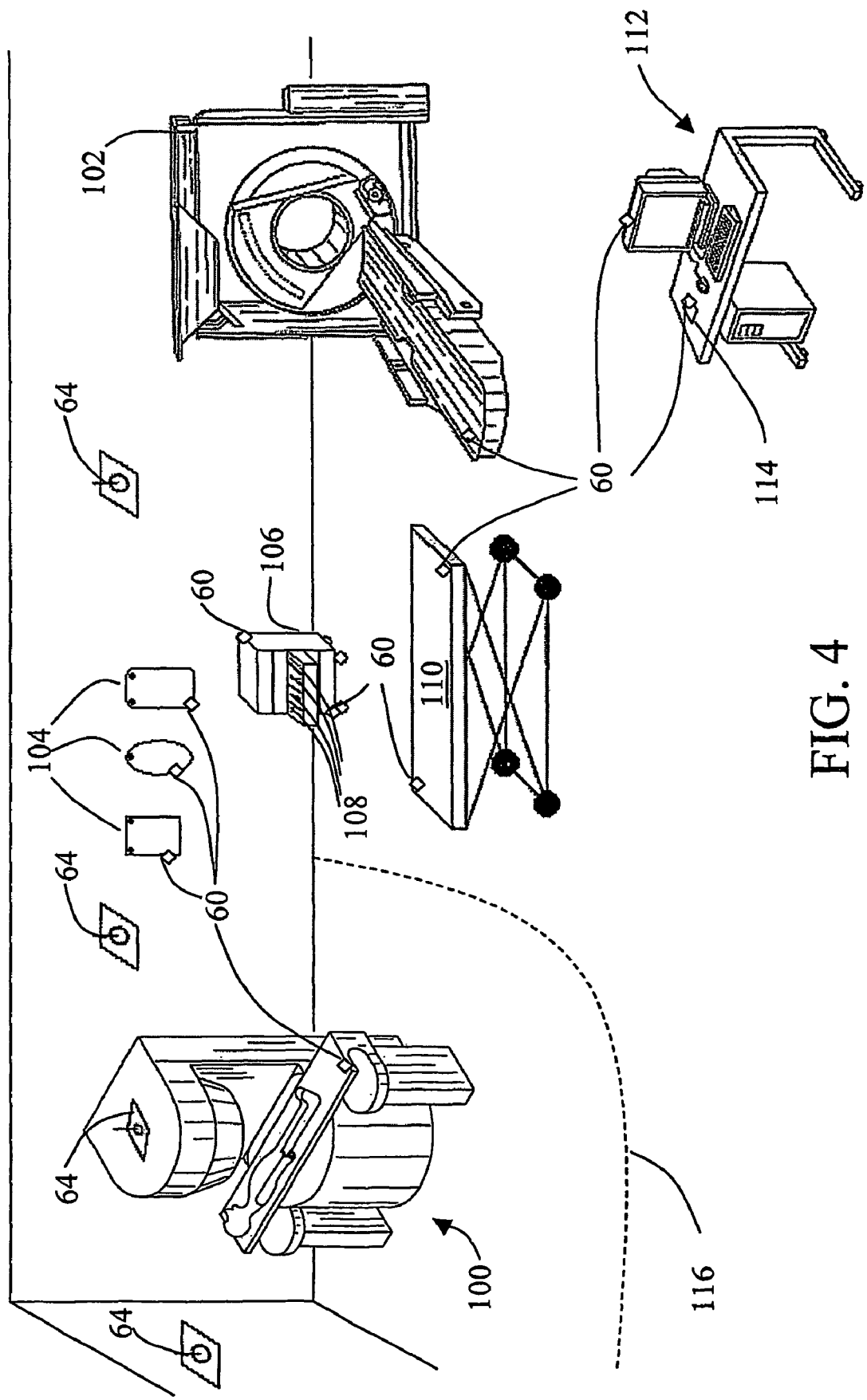
FIG. 4 is a diagrammatic illustration of an imaging suite with RFID transponders mounted on associated equipment.

With reference to FIG. 4, a combined modality imaging suite is depicted. A vertical field magnetic resonance scanner 100 and a CT scanner 102 are located within the suite. Also located within the suite are other objects, some of which are depicted in FIG. 4. It is to be understood, however, that the representations in FIG. 4 are not to be taken as an all-inclusive list of objects that can appear in an imaging suite. The objects depicted include RF coils 104, a tool chest 106, with individual tools 108, a gurney 110, a control station 112, and an ID badge 114. Also depicted are four reader/writer antennae 64, for interrogating and triangulating the locations of the transponders 60. Preferably, no three reader/writer antennae 64 are positioned such that a single line can intersect them. Each object is tagged with at least one transponder 60. Larger mobile objects, such as the gurney 110 or the tool chest 60, could be tagged with multiple transponders. Smaller objects such as individual tools 108 and RF local coils 104 preferably each receive a single transponder. In the preferred embodiment, a safety threshold 116 exists at a pre-determined distance from the MR scanner 100. Optionally, ar reader/writer antenna is embedded in the floor along the threshold 116 to interrogate and transponders 60 passing over it. If any of the transponders 60 are detected crossing the threshold 116 during unsanctioned times, an alarm or sequence interruption is triggered.

The invention has been described with reference to the preferred embodiments. Modifications and alterations will occur to others upon a reading and understanding of the preceding detailed description. It is intended that the invention be construed as including all such modifications and alterations insofar as they come within the scope of the appended claims or the equivalents thereof.

The invention claimed is:

1. A magnetic resonance apparatus comprising:
   a main magnetic field generating assembly located in a magnetic resonance suite that generates a substantially spatially constant main magnetic field through at least a portion of a subject in an imaging region;
   a gradient field generating assembly for overlaying spatially variant gradient magnetic fields onto the main magnetic field;
   a radio frequency assembly for exciting magnetic resonance in dipoles in the imaging region;
   a receiver for receiving magnetic resonance signals from the imaging region;
   at least one radio frequency transponder affixed to an object in the magnetic resonance suite;
   a transponder means for:
      interrogating the transponder; and,
      receiving data sent by the transponder, for indicating a location of the object to which it is affixed;
   wherein the data sent by the transponder includes an identity of the object with which it is associated, and further including
   a comparitor that compares the identity of the object with approved objects.

2. The magnetic resonance apparatus as set forth in claim 1, further including:
   a local radio frequency receive coil for receiving magnetic resonance signals, the at least one transponder being affixed to the coil, the transponder reporting the presence of the coil.

3. The magnetic resonance apparatus as set forth in claim 2, further including:
   a transponder communication antenna located adjacent the imaging region to interrogate each coil located in the imaging region.

4. The magnetic resonance apparatus as set forth in claim 3, wherein the magnetic field generating assembly is a bore type assembly and the communication antenna is located within the bore.

5. The magnetic resonance apparatus as set forth in claim 1, wherein the at least one transponder operates at a frequency that does not interfere with operation of the radio frequency assembly.

6. A magnetic resonance receiving coil and radio frequency transponder combination for use in the magnetic resonance apparatus of claim 1.

7. A magnetic resonance apparatus comprising:
   a main magnetic field generating assembly located in a magnetic resonance suite that generates a substantially spatially constant main magnetic field through at least a portion of a subject in an imaging region;
   a gradient field generating assembly for overlaying spatially variant gradient magnetic fields onto the main magnetic field;
   a radio frequency assembly for exciting magnetic resonance in dipoles in the imaging region;
   a receiver for receiving magnetic resonance signals from the imaging region;
   at least one radio frequency affixed to an object in the magnetic resonance suite;
   a transponder means for:
      interrogating the transponder; and,
      receiving data sent by the transponder, for indicating a location of the object to which it is affixed;
   a coil interrogator that determines through physical connections identities of coils that are connected; and,
   a means for comparing the identities to the connected coils with identities of coils identified by the transponder means.

8. The magnetic resonance apparatus as set forth in claim 7, wherein the data sent by the transponder includes an identity of the object with which it is associated, and further including
   a comparitor that compares the identity of the object with approved objects.

9. The magnetic resonance apparatus as set forth in claim 7, further including:
   a coil identity and connectivity database which correlates coil identities determined through physical connections with coil identities determined by the transponder means.

10. A magnetic resonance apparatus comprising:
    a main magnetic field generating assembly located in a magnetic resonance suite that generates a substantially spatially constant main magnetic field through at least a portion of a subject in an imaging region;
    a gradient field generating assembly for overlaying spatially variant gradient magnetic fields onto the main magnetic field;
    a radio frequency assembly for exciting magnetic resonance in dipoles in the imaging region;
    a receiver for receiving magnetic resonance signals from the imaging region;
    at least one radio frequency transponder affixed to an object in the magnetic resonance suite;
    a transponder means for:
       interrogating the transponder; and,
       receiving data sent by the transponder, for indicating a location of the object to which it is affixed;
    and at least one additional object located in the magnetic resonance suite that is tagged with at least one transponder the transponder storing and transmits an identity which correlates to the at least one additional object.

11. The magnetic resonance apparatus as set forth in claim 10, further including:
    an object list that correlates the identities of objects present in the magnetic resonance suite with transponder identities.

12. The magnetic resonance apparatus as set forth in claim 10, further including:
    transponder antennae that cooperatively derive a location of the at least one additional object and triggers an emergency procedure if the location is within a predetermined safety threshold.

13. A method of magnetic resonance comprising:
    generating a main magnetic field through an imaging region;
    overlaying gradient magnetic fields onto the main magnetic field;
    exciting magnetic resonance in selected dipoles of at least a portion of a subject located in the imaging region;
    receiving and demodulating the magnetic resonance; and
    interrogating at least one radio frequency transponder to indicate a location of a physical object with which it is associated;

transmitting a radio frequency signal detectable by the at least one transponder; and, the transponder responding with a return radio frequency signal that identifies the transponder;

wherein the at least one object includes at least one local coil and further including:

detecting whether the local coil with which the at least one transponder (60) is associated is electrically connected to an imaging system.

14. A method of magnetic resonance comprising:

generating a main magnetic field through an imaging region;

overlaying gradient magnetic fields onto the main magnetic field;

exciting magnetic resonance in selected dipoles of at least a portion of a subject located in the imaging region;

receiving and demodulating the magnetic resonance; and interrogating at least one radio frequency transponder to indicate a location of a physical object with which it is associated wherein the interrogating step includes:

interrogating additional radio frequency transponders associated with additional objects, each transponder reporting a unique identity.

15. The method as set forth in claim 14, wherein the interrogating step further includes:

transmitting a radio frequency signal detectable by the at least one transponder; and, the transponder responding with a return radio frequency signal that identifies the transponder.

16. The method as set forth in claim 15, wherein the at least one object includes at least one local coil and further including:

detecting whether the local coil with which the at least one transponder (60) is associated is electrically connected to an imaging system.

17. The method as set forth in claim 16, further including:

comparing all local coils identified from the received transponder radio signals as being in the imaging region with the local coils which are connected to the imaging system to identify any local coils in the imaging region which are not electronically connected to the imaging system.

18. The method as set forth in claim 15, wherein the step of transmitting includes transmitting in an RF band that is sufficiently removed from the operating frequency of radio frequency transmit and receive coils associated with a magnetic resonance device so as not to interfere with the operation of the coils.

19. The method as set forth in claim 14, wherein a plurality of the transponders are associated with objects that are to be maintained at least a pre-selected distance from the imaging region during imaging and further including:

interrogating at least any of the transponders which are within the pre-selected distance of the imaging region and warning that its associated object us within the pre-selected distance.

20. A magnetic resonance apparatus comprising:

a main magnetic field generating assembly for generating a main magnetic field in an imaging region;

a gradient field assembly for imposing spatially variant gradient fields onto the main magnetic field;

a radio frequency transmit/receive assembly for exciting magnetic resonance in selected dipoles within the imaging region;

at least one local radio frequency receive coil located within a bore of the magnetic resonance apparatus, the coil having an electrical connection to the magnetic resonance apparatus;

a radio frequency identification transponder attached to the receive coil that carries at least the identity of the receive coil in an on-board memory;

a connection interrogator that determines identities of coils electrically connected to the apparatus;

a transponder reader/writer that determines identities of coils physically present inside the bore;

a comparitor that detects discrepancies between the identities of the coils electrically connected to the apparatus and those physically present inside the bore.

* * * * *